(12) United States Patent
Shanley et al.

(10) Patent No.: US 12,198,915 B2
(45) Date of Patent: Jan. 14, 2025

(54) REFLECTION MODE DYNODE

(71) Applicant: ADAPTAS SOLUTIONS PTY LTD, Clyde (AU)

(72) Inventors: Toby Shanley, Clyde (AU); Wayne Sheils, Clyde (AU)

(73) Assignee: ADAPTAS SOLUTIONS PTY LTD, Clyde (AU)

( * ) Notice: Subject to any disclaimer, the term of this patent is extended or adjusted under 35 U.S.C. 154(b) by 225 days.

(21) Appl. No.: 17/610,919

(22) PCT Filed: May 16, 2020

(86) PCT No.: PCT/AU2020/050488
§ 371 (c)(1),
(2) Date: Nov. 12, 2021

(87) PCT Pub. No.: WO2020/227785
PCT Pub. Date: Nov. 19, 2020

(65) Prior Publication Data
US 2022/0223393 A1  Jul. 14, 2022

(30) Foreign Application Priority Data
May 16, 2019  (AU) ................ 2019901671

(51) Int. Cl.
*H01J 43/10* (2006.01)
*C23C 16/02* (2006.01)
(Continued)

(52) U.S. Cl.
CPC .......... *H01J 43/10* (2013.01); *C23C 16/0227* (2013.01); *C23C 16/26* (2013.01);
(Continued)

(58) Field of Classification Search
CPC . C23C 16/0272; C23C 16/274; C23C 16/278; C30B 25/10; C30B 25/18;
(Continued)

(56) References Cited

U.S. PATENT DOCUMENTS 4,810,882 A * 3/1989 Bateman ................ H01J 49/32
                                                            250/397
5,680,008 A   10/1997 Brandes et al.
(Continued)

FOREIGN PATENT DOCUMENTS

EP       0908917 A2      4/1999
EP       2797105 A1 * 10/2014 ............ H01J 49/025
(Continued)

OTHER PUBLICATIONS

Wang et al. (NPL: Secondary-electron emission from hydrogen-terminated diamond: Experiments and model) Physical Review Special Topics-Accelerators and Beams 14, 111301 (2011). (Year: 2011).*

(Continued)

*Primary Examiner* — Elmito Breval
(74) *Attorney, Agent, or Firm* — David D. Brush; Westman, Champlin & Koehler, P.A.

(57) ABSTRACT

A device configured to convert or amplify a particle, the conversion or amplification being reliant on the impact of a particle on a surface of the device causing emission of one or more secondary electrons from the same surface. The device includes a carbon-based layer capable of secondary electron emission upon impact of a particle. The surface may be used to convert, for example, an ion into an electron signal, or an electron signal into an amplified electron signal, such as in conversion or amplification dynodes.

13 Claims, 6 Drawing Sheets

(51) Int. Cl.
  *C23C 16/26* (2006.01)
  *C23C 16/511* (2006.01)
  *C23C 16/56* (2006.01)
  *C30B 25/02* (2006.01)
  *C30B 29/04* (2006.01)
  *C30B 31/06* (2006.01)
  *H01J 9/12* (2006.01)

(52) U.S. Cl.
  CPC ............ *C23C 16/511* (2013.01); *C23C 16/56* (2013.01); *C30B 25/02* (2013.01); *C30B 29/04* (2013.01); *C30B 31/06* (2013.01); *H01J 9/125* (2013.01)

(58) Field of Classification Search
  CPC .. C30B 28/14; C30B 31/08; H01J 1/32; H01J 25/76; H01J 43/04; H01J 49/025; H01J 43/246
  See application file for complete search history.

(56) References Cited

U.S. PATENT DOCUMENTS

| | | | |
|---|---|---|---|
| 8,389,929 B2 * | 3/2013 | Schoen | H01J 49/42 250/281 |
| 9,035,540 B2 | 5/2015 | Nuetzel et al. | |
| 2004/0041092 A1 * | 3/2004 | Yamaguchi | H01J 49/025 250/397 |
| 2008/0187093 A1 | 8/2008 | Price et al. | |
| 2009/0315443 A1 | 12/2009 | Sullivan et al. | |
| 2009/0321633 A1 | 12/2009 | Blick et al. | |
| 2013/0240907 A1 | 9/2013 | Nutzel et al. | |

FOREIGN PATENT DOCUMENTS

| | | |
|---|---|---|
| JP | 2000113851 A | 4/2000 |
| JP | 2013538000 A | 10/2013 |
| WO | 9633507 A1 | 10/1996 |

OTHER PUBLICATIONS

International Search Report dated Jun. 18, 2020 for corresponding PCT/AU2020/050488 filed on May 16, 2020.

Written Opinion dated Jun. 18, 2020 for corresponding PCT/AU2020/050488 filed on May 16, 2020.

First Chinese Office Action and Search Report dated Feb. 7, 2024, for corresponding Chinese Application No. 202080036350.7.

Japanese Notice of Reasons for Refusal dated Jan. 24, 2024, for corresponding Japanese Application No. 2021-566500.

Mearini G. T., et al., "Fabrication of an electron multiplier utilizing diamond films" Thin Solid Films, vol. 253, Issue 1/2, dated Dec. 15, 1994, pp. 151-156.

* cited by examiner

REFLECTION MODE DYNODE

The present application is a Section 371 National Stage Application of International Application No. PCT/AU2020/050488, filed May 16, 2020 and published as WO 2020/227785 A1 on Nov. 19, 2020, in English, which claims priority from Australian provisional patent application 2019901671, filed May 16, 2019, the contents of which are hereby incorporated by reference in their entireties.

FIELD OF THE INVENTION

The present invention relates to electron emissive surfaces capable of releasing electrons in response to impact by a particle including an ion, a neutral atom, a neutral molecule, a proton, a neutron, an electron or a photon. These surfaces may be used to convert, for example, an ion into an electron signal, or an electron signal into an amplified electron signal. The invention is particularly applicable to conversion or amplification dynodes.

BACKGROUND TO THE INVENTION

In many scientific applications, it is necessary to detect an ion, a neutral atom, a neutral molecule, a proton, a neutron, an electron or a photon. Typically, a detector is comprised of a first conversion surface (dynode), with which an incident particle collides and emits secondary electrons that are subsequently amplified in a multiplying section. Alternatively, the first conversion surface can emit particles other than electrons that interact with a send conversion surface, and that second conversion surface emits secondary electrons that are subsequently amplified in a multiplying section of the detector.

The multiplying section of a detector generally operates by way of secondary electron emission whereby the impact of a single or multiple particles on the multiplier impact surface causes single or (preferably) multiple electrons associated with atoms of the impact surface to be released. Generally, the multiplying section comprises a chain of dynodes, each of which sequentially amplifies the electron signal of the dynode before it in the chain.

A practical example of the use of electron emissive surfaces is in ion detectors as used in a mass spectrometers. In mass spectrometers, the analyte is ionized to form a range of charged particles (ions). The resultant ions are then separated according to their mass-to-charge ratio, typically by acceleration and exposure to an electric or magnetic field. The separated signal ions impact on an ion detector surface (which is electron emissive) to generate one or more secondary electrons. These secondary electrons are then directed toward a dynode chain that functions to significantly multiply the electron signal generated by the ion detector conversion surface. The electron signals output by the electron multiplier are displayed as a spectrum of the relative abundance of detected ions as a function of the mass-to-charge ratio.

The detection efficiency (or sensitivity) of electron multipliers is in part limited by the statistics of secondary electron generation upon particle (ion) impact with a surface. Due to the statistical nature of secondary electron generation, surfaces comprised of a relatively low average secondary electron yield material have a high rate of non-emission events leading to non-detection or false-negative results. In contrast, a higher average secondary electron yield material has a lower rate of non-emission, which leads to higher detection efficiencies.

Sensitivity of detectors is a core performance specification and accordingly artisans in this field continually seek improvements in materials and construction so as to maximize the yield of secondary electrons from electron emissive surfaces. The industry standard for sensitivity has not changed in some decades, and it is against this general lack of success that the present invention is provided.

A further problem in the art is electron emissive surfaces may accumulate charge under higher levels of irradiation. This accumulation of charge may arise from the integration of incident charge as well as the emission of secondary electrons, resulting in an uncontrolled change of electrical potential at the conversion surface and ultimately leading to failure of the detector.

It is an aspect of the present invention to provide an improvement in secondary electron yield from emissive surfaces. It is a further aspect of the prior art to provide a useful alternative to prior art electron emissive surfaces.

The discussion of documents, acts, materials, devices, articles and the like is included in this specification solely for the purpose of providing a context for the present invention. It is not suggested or represented that any or all of these matters formed part of the prior art base or were common general knowledge in the field relevant to the present invention as it existed before the priority date of each claim of this application.

SUMMARY OF THE INVENTION

After considering this description it will be apparent to one skilled in the art how the invention is implemented in various alternative embodiments and alternative applications. However, although various embodiments of the present invention will be described herein, it is understood that these embodiments are presented by way of example only, and not limitation. As such, this description of various alternative embodiments should not be construed to limit the scope or breadth of the present invention. Furthermore, statements of advantages or other aspects apply to specific exemplary embodiments, and not necessarily to all embodiments (or even any embodiment) covered by the claims.

Throughout the description and the claims of this specification the word "comprise" and variations of the word, such as "comprising" and "comprises" is not intended to exclude other additives, components, integers or steps.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may.

In a first aspect, but not necessarily the broadest aspect, the present invention provides a device configured to convert or amplify a particle, the conversion or amplification being reliant on the impact of a particle on a surface of the device causing the emission of one or more secondary electrons from the same surface, wherein the device comprises a carbon-based layer capable of secondary electron emission upon impact of a particle.

Applicant has unexpectedly found significant practical advantage in the use of carbon-based layers (such as diamond films) as an electron emissive layer for a reflection mode dynode. Particularly, it is proposed that the sensitivity of electron multiplication detection systems is improved by the use of a substantially continuous film of diamond that is doped or otherwise configured to be sufficiently electrically conductive for use as a reflection mode dynode.

In one embodiment of the first aspect, the device is configured as a conversion dynode or an amplification dynode or a microchannel wafer or a microchannel plate.

In one embodiment of the first aspect, the conversion dynode or amplification dynode is configured to operate in reflection mode. As will be appreciated reflection mode devices are structurally and functionally distinguished from devices dedicated to operating in transmission mode. A reflection mode device is configured such that a single face of the device both receives an incident particle and emits the resultant secondary electrons. By contrast, a device which operates in transmission mode has a first face which receives an incident particle, and a second face which emits the resultant secondary electrons.

The structural and functional differences between reflection and transmission mode devices known at the present filing date inform as to the structural and functional features of the present devices (being directed to reflection mode devices) that may distinguish from transmission mode devices. Any of these distinguishing features may constitute a feature of the present reflection mode devices.

One difference between these two modes are the thickness of the dynodes. In reflection mode, the thickness of the emission layer is typically in the micron order or larger. However, in transmission mode, much thinner dynodes are required to obtain a useful secondary electron yield. Reflection-type dynodes are not constrained by a maximum thickness of the diamond-based material, thereby relaxing the degree of manufacturing control required in their manufacture. Furthermore, reflection dynodes can be manufactured on a non-planar substrate to conveniently enable electrical field design conducive to focusing dynodes.

In one embodiment of the first aspect, the carbon-based layer is a diamond layer or a diamond-like carbon layer. As used herein, the term "diamond" includes the diamond allotrope of pure carbon, being carbon atoms bonded into a tetrahedral network via $sp^3$ orbitals. As will be detailed infra, a diamond layer may be doped with an impurity to increase electrical conductivity, and in that regard would not be considered a "pure" diamond. Although less preferred, undoped diamond may be used where it is formed in a manner that confers some conductivity on the substance (one example being formation by chemical vapour deposition).

It is contemplated that the carbon-based layer may be formed from a diamond-like carbon. As known to the skilled artisan diamond-like carbon materials comprise appreciable levels of $sp^3$ hybridised carbon atoms, and accordingly these materials have many similarities to the diamond allotrope of pure carbon having purely $sp^3$ bonding. Some forms of diamond-like carbon are capable of emitting secondary electrons, tetrahedral amorphous carbon (ta-C) being one such example.

In one embodiment of the first aspect, the carbon-based layer is doped to increase conductivity. The carbon based layer may have zero or low levels of conductivity which may be improved by the introduction of a dopant during formation of the layer. The dopant atom substitutes for carbon in the diamond lattice, thereby donating a hole into the valence band. The level of dopant used may be arrived at by the skilled person having regard to the final electrical conductivity required for the material to function efficiently as an electron emissive surface.

The dopant type and concentration alters the transport of secondary electrons through the layer bulk, in addition to the electrical conductivity required to replace the secondary electrons emitted. In one embodiment of the first aspect, the dopant is a p-type dopant (preferably boron), but may in other embodiments be n-type (such as nitrogen). The dopant may be boron or nitrogen, but is preferably boron. Where boron is the dopant, concentrations of greater than $10^{19}$ cm$^{-3}$ may be useful in the context of a reflection mode dynode. Greater levels of electrical conductivity will be seen where boron is used at a concentration of greater than $10^{20}$ cm$^{-3}$ or greater than $10^{21}$ cm$^{-3}$, or greater than $10^{22}$ cm$^{-3}$.

In one embodiment of the first aspect, the carbon-based layer has a crystalline structure. For example, the layer may have a polycrystalline, nano-crystalline, ultra-nano-crystalline, or single crystalline structure. In one embodiment of the invention, the layer comprises grain sizes at the nano- (1 to 100 nm) and/or ultra-nano (less than 5 nm) scales.

Layers having useful properties are proposed to be polycrystalline diamond having an average or median grain size of between about 1 nm and about 1000 nm. In the exemplary embodiments disclosed herein, grain sizes of around 1 μm were shown to be useful. As will be appreciated, given the heterogenous nature of polycrystalline materials a range of grain sizes will be found in any given sample. In other embodiments, median grain size may be greater than about 1 μm, and may be up to about 10 μm, 20 μm, 30 μm, 40 μm, 50 μm, 60 μm, 70 μm, 80 μm, 90 μm or 100 μm.

In one embodiment of the first aspect, the carbon-based layer has a minimum thickness to prevent or inhibit the passage of high energy particles therethrough. As will be appreciated, there will be a general preference for avoiding a particle incident on the carbon-based layer from not travelling the depth from which any secondary electrons that are generated may escape from the incident surface. A particle passing completely through the layer may not emit the maximum number of secondary electrons that would otherwise be achievable. As will be further appreciated, the penetration distance will not be a single value and instead a distribution of distances will be expected. In that regard, a mean or median penetration distance may be considered when determining the required depth of the carbon-based layer. In addition or alternatively, the thickness may be a minimum thickness providing for a required secondary electron yield.

To ensure that all, or almost all incident particles are captured in the layer, the layer depth may be set by reference to a multiple of the mean or median depth of penetration. In that regard, a multiple of 1.5, 2, 2.5, 3, 3.5, 4, 4.5, 5, 5.5, 6, 6.5, 7, 7.5, 8, 8.5, 9, 9.5, 10, 15, 20, 25, 30, 35, 40, 45, 50, 55, 60, 65, 70, 75, 80, 85, 90, 95 or 100 may be used. An appropriate multiple may be informed by a consideration of the range of penetration distances within the distribution; a lesser distance range informing of a lesser multiple and vice versa.

The carbon-based layer may be of any thickness, however maximum thickness may be dictated by ease of fabrication or considerations of economy.

In one embodiment of the first aspect, the carbon-based layer has a thickness of between about 1 nm and about 500 nm, or between about 1 nm and about 100 nm. Where the carbon-based layer is formed from nanocrystalline diamond, the layer thickness may be greater than 10 μm.

In one embodiment of the first aspect, the carbon-based layer is formed by a growth process on a substrate. In the context of the present invention, the term "growth" means that the layer is not preformed separately and then applied to the substrate. Instead, the carbon-based layer is grown on the substrate in situ, such that the thickness of the layer increases during the growing process.

In one embodiment of the first aspect, the growth process is a deposition process. For example, growth may be achieved by a vapour deposition process. This method is reliant on the coating material being presented to the substrate in a vapour state and deposited via condensation, chemical reaction, or conversion. Examples of vapour deposition methods include physical vapour deposition (PVD) and chemical vapour deposition (CVD). In PVD, the substrate is subjected to plasma bombardment. In CVD, thermal energy heats gases in a coating chamber, driving the deposition reaction. Vapour deposition methods are usually performed within a vacuum chamber.

In one embodiment of the first aspect, the vapour deposition method is a physical vapour deposition method, which may be a plasma-based method, or a sputtering method (such as a high power impulse magnetron sputtering method).

Physical vapour deposition methods are typically reliant on dry vacuum deposition in which a coating material is deposited over the substrate. Reactive PVD hard coating methods generally require a method for depositing the material, an active gas (such as nitrogen, oxygen, or methane), and plasma bombardment of the substrate.

Sputtering alters the physical properties of a surface. In this process, a gas plasma discharge is provided between a cathode coating material and an anode substrate. Positively charged gas ions are accelerated into the cathode. The impact displaces atoms from the cathode, which then impact the anode and coat the substrate. A film forms on the substrate as atoms adhere to the substrate. Three techniques for sputtering are available to the skilled person for potential use in the present invention: diode plasmas, RF diodes, and magnetron-enhanced sputtering.

The steps in a typical CVD process are as follows: generation of the reactive gas mixture, transport of reactant gas to the surface to be coated, adsorption of the reactants on the surface to be coated, and reaction of the adsorbents to form the coating.

To explain further, the reactant gas mixture is contacted with the substrate. The coating material is delivered by a precursor material (termed a reactive vapour) which may be dispensed as a gas, liquid, or in solid phase. The gases are fed into a chamber under ambient pressures and temperatures while solids and liquids are provided at high temperature and/or low pressure. Once resident in the chamber, energy is applied to the substrate surface to facilitate the coating reaction with the carrier gas.

Pre-treatment of the substrate surface is generally required in vapour deposition methods, and particularly in CVD. Mechanical and/or chemical means may be used before the substrate enters the deposition reactor. Cleaning is typically effected by ultrasonic cleaning and/or vapour degreasing. To facilitate adhesion of the coating, vapour honing may be used. During the coating process, surface cleanliness is maintained to prevent particulates from entering in the coating. Mild acids or bases may be used to slough oxide layers which may have formed during the heat-up step. Post-treatment of the coating may include exposure to heat to cause diffusion of the coating material across the surface.

In the exemplary embodiment, CVD was implemented in the presence of a hydrogen plasma so as to inhibit growth of graphitic carbon bonds. Nanodiamond particles were firstly dispersed onto the substrate, and the polydiamond grown from the particles.

In one embodiment of the first aspect, the coating material is deposited on the substrate surface by a thermal spray method, including a combustion torch method, a flame spraying method, a high velocity oxy fuel method, a detonation gun method, an electric arc spraying method and a plasma spraying method. Nanocrystalline-diamond particles may be produced in the form of a coating by depositing Ni-clad graphite powder in a high-velocity thermal spray method. Particles are accelerated to impact and form a film on a metal substrate. Electron microscopy reveals that the deposited layer contains cubic diamond nanocrystals having a size range of 5 to 10 nm.

There exists three basic categories of thermal spray technologies: combustion torch methods (including flamespray, high-velocity oxy fuel, and detonation gun methods), electric (wire) arc methods, and plasma arc methods.

Flame spraying methods involve feeding gas and oxygen through a combustion flame spray torch. The layer material is fed into the flame. The layer material is heated to about or higher than its melting point, and then accelerated by combustion of the layer material. The so-formed molten droplets flow on the surface to form a continuous and even coating.

High-velocity oxy fuel (HVOF) methods require the layer material to be heated to a temperature of about or greater than its melting point, and then deposited on the substrate by a high-velocity combustion gas stream. The method is typically carried out in a combustion chamber to enable higher gas velocities. Fuels used in this method include hydrogen, propane, or propylene.

Plasma spraying relies on introduction of a flow of gas (typically argon) between a water-cooled anode and a cathode. A direct current arc passes through the gas stream causing ionization and the formation of a plasma. The plasma heats the layer material (in powder form) to a molten state. Compressed gas directs the material onto the substrate.

Other methods of diamond growth include high pressure high temperature (HPHT); detonation; and ultrasound cavitation methods.

In one embodiment of the first aspect, the carbon-based layer formed by growth on a substrate is subjected to post-growth modification. The modification may be effected to improve any mechanical, physical, chemical, electrical, thermal, or other property of the grown layer as required or desired. In one embodiment of the first aspect, the post-growth modification creates a negative electron affinity of at least a portion of the carbon atoms of the carbon-based layer. A very low or even negative electron affinity at the layer surface permits low-energy quasithermalized electrons to reach the surface and escape into the surrounding vacuum.

In one embodiment of the first aspect, the post-growth modification causes termination of the carbon atoms of the carbon-based layer. The termination may be effected by hydrogen, fluorine or an alkali earth metal such as caesium. As will be appreciated, some termination atoms will be preferred over others when having regard to the desired end result of increasing the negative electron affinity of the layer surface.

Preferably the surface of the layer is substantially saturated with the termination atom.

After chemical vapour deposition of diamond, the (100) and (111) surfaces may be naturally terminated by hydrogen at least to some extent, and accordingly no specific steps need be taken to effect termination.

However, where termination is required (or greater levels of termination are desired) then active steps may be taken to effect termination. For example, where hydrogen termination is required this is often has been achieved using atomic hydrogen produced by either plasma or hot filament techniques as known to the skilled artisan. In one embodiment of the first aspect, the post-growth modification is by exposure of the carbon-based layer to a gas plasma (typically hydrogen gas).

Alternative methods use high temperature molecular hydrogen to hydrogenate the surface of diamond films, even at atmospheric pressure. Hydrogen termination of chemical vapour deposited diamond films may be due to the formation of surface carbon dangling bonds and carbon-carbon unsaturated bonds at the applied temperature, which are reactive with molecular hydrogen to produce a hydrogen-terminated surface.

The present device may comprise a substrate which, at least in part, acts to support the electron emissive layer. Where the electron emissive layer is exceedingly thin, mechanical support may be required. The substrate may provide other structural or functional effects.

While non-conductors (such as silicon) are capable of having microcrystalline diamond layered thereon, for applications in electron multipliers electrical conductivity is required. In that regard, a non-conducting substrate may nevertheless be used, and the carbon-based layer electrically connected to a power source.

In one embodiment of the first aspect, the substrate is a metal or metal alloy such as nickel or steel. The use of more exotic metals and alloys may provide advantage.

In one embodiment of the first aspect, the metal is a transition metal, and may be a second row or third row transition metal such as molybdenum, or tungsten. Molybdenum was utilised as a substrate in the exemplary embodiments given its high melting point and low thermal coefficient of expansion.

The present devices may be used in any useful context, such as to convert an incident (non-electron or electron) particle into one or more secondary electrons.

The devices of the present invention may provide a secondary electron yield of at least 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, or 100 electrons. In preferred forms of the invention yields of at least 5, 10 or 15 electrons for incident electron energies in the range of about 200 to about 1000 are provided In a second aspect, the present invention provides an electron multiplier comprising one or more devices of any embodiment of the first aspect.

With regard to applications of the present reflection mode devices for use in a discrete dynode electron multiplier, it is contemplated that not all dynodes in the amplification chain of the multiplier will benefit equally from the use of a carbon-based coating (as compared with another coating). As will be clear from the comparative data shown in FIG. 4 (the generation of which is disclosed in greater detail infra), no significant advantage in terms of secondary electron yield for the present invention is noted for electron energies of up to about 100 eV, with the present devices being superior in terms of yield at higher energies.

Apart from secondary electron yield, use of a carbon-based layer on a dynode may provide advantage in that contaminant species may be less likely to adsorb thereon, providing greater stability or a longer service life. Furthermore, a carbon-based layer may be less susceptible to deterioration by corrosive chemicals such as chlorine and fluorine.

As another possibility, a device of the present invention may be used only as a conversion dynode within a detector, with the multiplying dynodes being all standard dynodes. In this way, an improved yield of secondary electrons (compared with a prior art conversion dynode) is obtained only at the conversion dynode, with the remainder of the multiplier being standard.

In general terms, the advantage to using the present devices in only some dynodes may be economic given the likely lower cost of standard dynodes.

In general regard to the application of the present invention to electron multipliers, with the exception of any reflection dynode(s) used the multiplier may be configured in accordance with the prior art. As is conventional in an electron multiplier, a first electron emissive surface (of the first dynode in a series of dynodes) is provided which is configured to receive an input particle, and in response to the impact of the input particle emit one or multiple electrons. Where multiple electrons are emitted (which is typical), an amplification of the input signal results. As is also conventional, a series of second and subsequent electron emissive surfaces is provided. The function of these emissive surfaces is to amplify the electron(s) which are emitted from the first emissive surface. As will be appreciated, amplification occurs typically at each subsequent emissive surface of the series of emissive surfaces. Typically, the secondary electrons emitted by the final emissive surface are directed onto an anode surface, with the current formed in the anode feeding into a signal amplifier and subsequently an output device.

Reference is made to FIG. 5 showing an exemplary form of an electron multiplier. With an electron multiplier, a linear path is defined between opposing dynodes as shown in FIG. 5, being a highly diagrammatic representation of the dynodes of a conventional discrete dynode electron multiplier (100). Each of the dynodes in the electron amplification chain are sequentially numbered (115a through 115g). Any one or more of the dynodes (115) may be a dynode of the present invention. The path of an incoming particle (120) is shown at the entry of the multiplier (10), with the subsequent amplification leading to an avalanche of electrons (125).

In the context of an electron multiplier, the present invention may provide advantage in that a reflection mode dynode or series of reflection mode dynodes may be operated at a lower voltage, thereby providing extra voltage overhead for a longer service life whilst not compromising on secondary electron yield.

Given the increase in secondary electron yield available by way of the present invention, an electron multiplier may comprise less than the conventional number of dynodes. For example, a prior art multiplier having 12 dynodes may function acceptably using only 6 of the present dynodes if each of the present dynodes has a two-fold secondary electron yield compared with the prior art dynode, and where the secondary electron yield of the prior art material is equal to or less than two. The use of lower dynode numbers allows for an amplifier to be constructed with a smaller volume, a lighter weight, more simply, using less materials, using a smaller number of components, or at a lower cost.

Dynodes having a carbon-based layer may have another advantage in that an increased chemical inertness could confer utility in the detection of reactive species that would otherwise degrade a prior art dynode.

The present invention has particular applicability in the context of mass spectrometers, which typically utilize discrete dynode electron multipliers whereby the dynodes of the multiplier operate in reflection mode. In that regard, the present invention provides as a third aspect a mass spectrometer comprising one or more devices of any embodiment of the first aspect, or an electron multiplier of the second aspect.

Apart from inclusion of the present devices, the mass spectrometer may be otherwise constructed conventionally, as illustrated in FIG. 6 showing a mass spectrometer in combination with a gas chromatography system.

The present invention may be embodied in a third aspect, being a method of fabricating an electron emissive device operable in reflection mode. It will be understood that in describing the device aspects of the present invention, various features relating to methods for fabrication are discussed. So far as they are applicable to a method of fabrication, features described with reference to the present devices are incorporated herein by reference to the following discussion of the present methods. For example, features of post-growth modification of the carbon-based layer are used herein to characterize the device per se, however such features may also be applicable to the present methods.

The third aspect of invention, may in particular, provide a method for fabricating a device configured to convert or amplify a particle, the conversion or amplification being reliant on the impact of a particle on a surface of the device causing the emission of one or more secondary electrons from the same surface, the method comprising the steps of providing a substrate, and forming a carbon-based layer on the substrate.

In one embodiment of the third aspect, the substrate is suitable for use in a reflection mode dynode or microchannel wafer or a microchannel plate.

In one embodiment of the third aspect, the dynode is a conversion dynode or an amplification dynode or a microchannel wafer or a microchannel plate.

In one embodiment of the third aspect, the carbon-based layer is a diamond layer or a diamond-like carbon layer.

In one embodiment of the third aspect, the carbon-based layer is formed with a dopant to increase conductivity. Optionally the dopant is boron.

In one embodiment of the third aspect, the carbon-based layer is formed as a monocrystalline diamond layer.

In one embodiment of the third aspect, the carbon-based layer is formed so as to have a minimum thickness to provide for a required secondary electron yield.

In one embodiment of the third aspect, the carbon-based layer is formed to have a thickness of between about 1 nm and about 500 nm, or between about 1 nm and about 100 nm.

In one embodiment of the third aspect, the carbon-based layer is formed by a growth process on the substrate. Optionally the growth process is a deposition process, such as a vapour deposition process.

In one embodiment of the third aspect, the carbon-based layer formed by growth on the substrate is subjected to a post-growth modification step. Optionally the post-growth modification step increases the negative electron affinity of at least a portion of the carbon atoms of the carbon-based layer. The post-growth modification step may cause termination (such as hydrogen termination) of at least a portion of the carbon atoms of the carbon-based layer.

In one embodiment of the third aspect, the post-growth modification step is by exposure of the carbon-based layer to a gas plasma. Optionally the gas plasma is generated from hydrogen gas, which may be heated hydrogen gas.

In one embodiment of the third aspect, the substrate is a metal, and optionally a transition metal. The transition metal may be a second row or third row transition metal, optionally the second row transition metal being molybdenum, or the third row transition metal being tungsten.

DETAILED DESCRIPTION OF ILLUSTRATIVE EMBODIMENTS

The invention will be further described by reference to a highly preferred embodiments with regard to the device and method used to fabricate the device. It is emphasised that the embodiments in this section are strictly non-limiting in scope.

Figure 1:
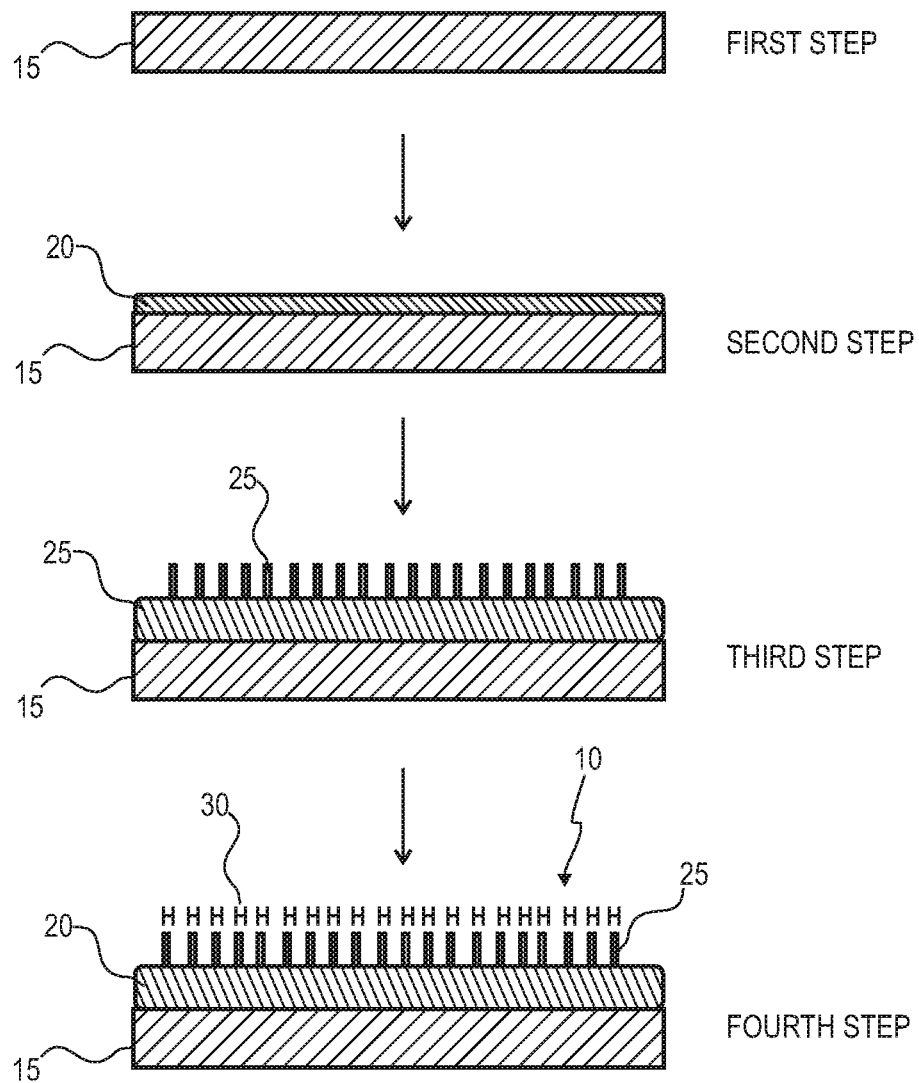
FIG. 1 is a highly schematic diagram illustrating the steps involved in the fabrication of a reflection mode dynode of the present invention.

With regard to the highly preferred method, reference is made to FIG. 1 which illustrates highly diagrammatically the fabrication of a dynode (10) operable in reflection mode.

The first step is the provision of a substrate (15) which in this embodiment is molybdenum having a planar upper surface of dimension 50 mm×50 mm and a thickness of 1 mm. The substrate was cleaned by sonication followed by exposure to oxygen plasma. After cleaning, the planar upper surface was spin coated with nanodiamond particles.

The second step is the commencement of growing a boron-doped polycrystalline diamond film (20) on one face of the substrate (15). The film was deposited by a plasma assisted chemical vapour deposition method (PA-CVD), at a pressure of 70 Torr, with a microwave power of 900 Watts, and at a temperature of 700° C. to 1000° C. During growth, gases were introduced into the pressurised chamber at predetermined flow rates as tabled below.

| Step | Time (min) | Pressure (Torr) | Heater (Deg. C.) | Power (Watts) | $H_2$ (SCCM) | $CH_4$ (SCCM) | $B(CH_3)_3$ (SCCM) | $O_2$ (SCCM) |
|---|---|---|---|---|---|---|---|---|
| 1 | 0.5 | 10 | 0 | 0 | 100 | 1 | 0 | 0 |
| 2 | 0.5 | 10 | 300 | 0 | 100 | 1 | 0 | 0 |
| 3 | 0.2 | 10 | 300 | 400 | 100 | 1 | 0 | 0 |
| 4 | 0.2 | 10 | 300 | 500 | 100 | 1 | 0 | 0 |
| 5 | 0.2 | 10 | 300 | 600 | 150 | 2 | 0 | 0 |
| 6 | 0.5 | 20 | 300 | 700 | 200 | 2.5 | 0 | 0 |
| 7 | 0.5 | 30 | 300 | 1000 | 250 | 3 | 0 | 0 |
| 8 | 0.5 | 30 | 400 | 900 | 300 | 3 | 0 | 0 |
| 9 | 5 | 60 | 500 | 900 | 300 | 3 | 0 | 0 |
| 10 | 480 | 70 | 500 | 900 | 100 | 4 | 5 | 0.3 |
| 11 | 480 | 70 | 600 | 900 | 100 | 4 | 5 | 0.3 |
| 12 | 240 | 70 | 600 | 900 | 100 | 4 | 5 | 0.3 |
| 13 | 180 | 70 | 600 | 900 | 100 | 4 | 5 | 0.3 |
| 14 | 360 | 70 | 600 | 900 | 100 | 4 | 5 | 0.3 |
| 15 | 480 | 80 | 600 | 900 | 100 | 4 | 5 | 0.3 |
| 16 | 480 | 90 | 700 | 1200 | 300 | 2.5 | 0.15 | 0 |
| 17 | 10 | 90 | 700 | 1100 | 300 | 2.5 | 0.15 | 0 |
| 18 | 2 | 40 | 700 | 1000 | 300 | 0 | 0 | 0 |
| 19 | 2 | 40 | 0 | 0 | 250 | 0 | 0 | 0 |
| 20 | 2 | 30 | 0 | 0 | 250 | 0 | 0 | 0 |
| 21 | 2 | 20 | 0 | 0 | 150 | 0 | 0 | 0 |
| 22 | 2 | 10 | 0 | 0 | 100 | 0 | 0 | 0 |
| 23 | 25 | 80 | 0 | 0 | 300 | 0 | 0 | 0 |

With reference to the above table, growth of the diamond layer occurs from step 10 to step 15.

Growth of the film (in terms of depth) continues until the required depth is achieved, as shown in the third step. In this embodiment, a film thickness of about 10 μm was used. Thicknesses between about 5 μm and about 30 μm are contemplated to be useful in the context of this preferred method.

On the exposed surface of the deposited film (20) are shown surface carbon dangling bonds and carbon-carbon unsaturated bonds (collectively marked 25). These bonds will be present on the surface of the diamond film (25) as it is growing, but shown only at the third step for clarity.

The fourth step shows the result of hydrogen termination of the surface bonds (25). This termination is achieved by the introduction of molecular hydrogen into the pressurized chamber once the required film depth is achieved. Ionized hydrogen is generally present in the reaction chamber to inhibit growth of graphitic carbon. Upon completion of growth the hydrogen concentration is increased while the surface is still exposed to the plasma.

The boron-doped diamond film produced by the method described above was analysed by scanning electron microscopy. The resultant micrographs shown in FIG. 2 reveal a surface consistent with an underlying polycrystalline structure.

Figure 3:
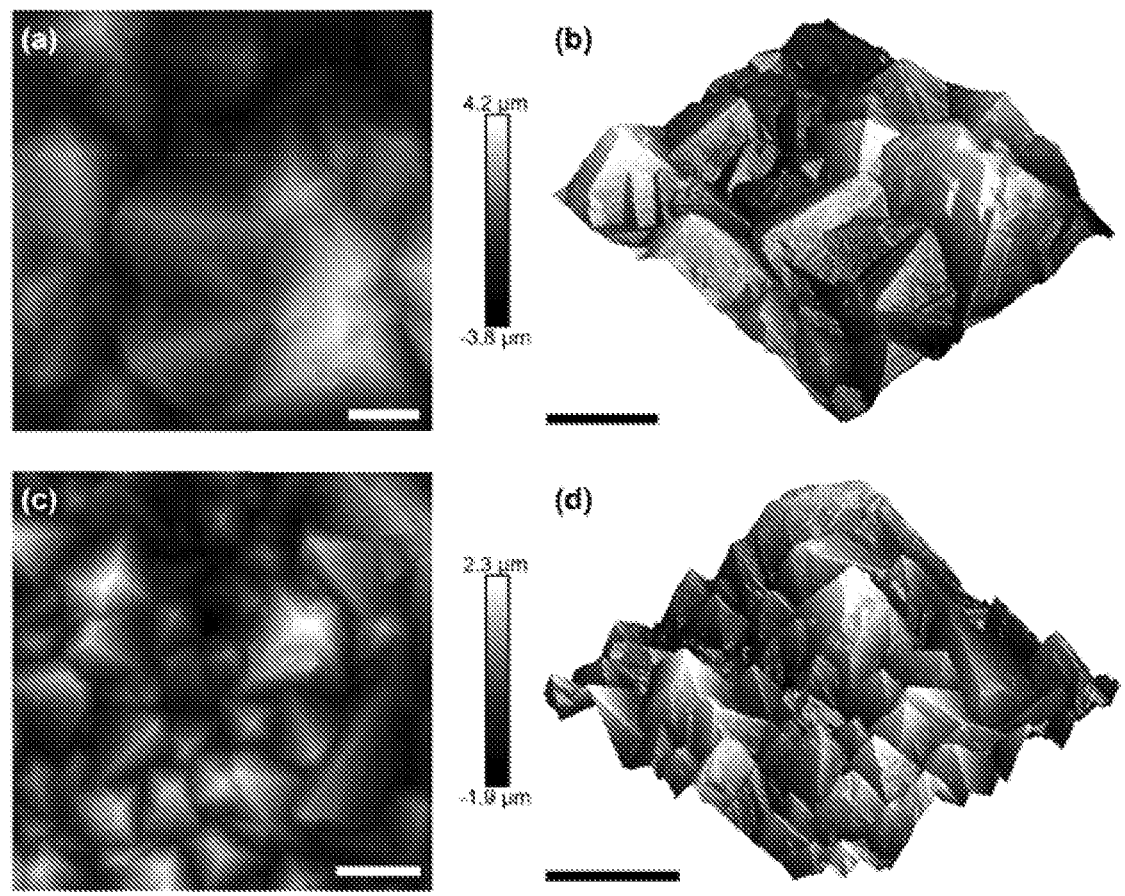
FIG. 3 is a series of atomic force microscopy images of a boron-doped polycrystalline diamond grown on a molybdenum substrate. Two different regions were imaged. Panels (a) and (b) are directed to a first region, and panels (c) and (d) to a second region. The panels (b) and (d) are three dimensional representations of the topographic images of panels (a) and (c) respectively. Scale bar=5 μm.

The film was also analysed by atomic force microscopy, the micrographs being present in FIG. 3. Again, a surface consistent with a polycrystalline structure is revealed.

Figure 2:
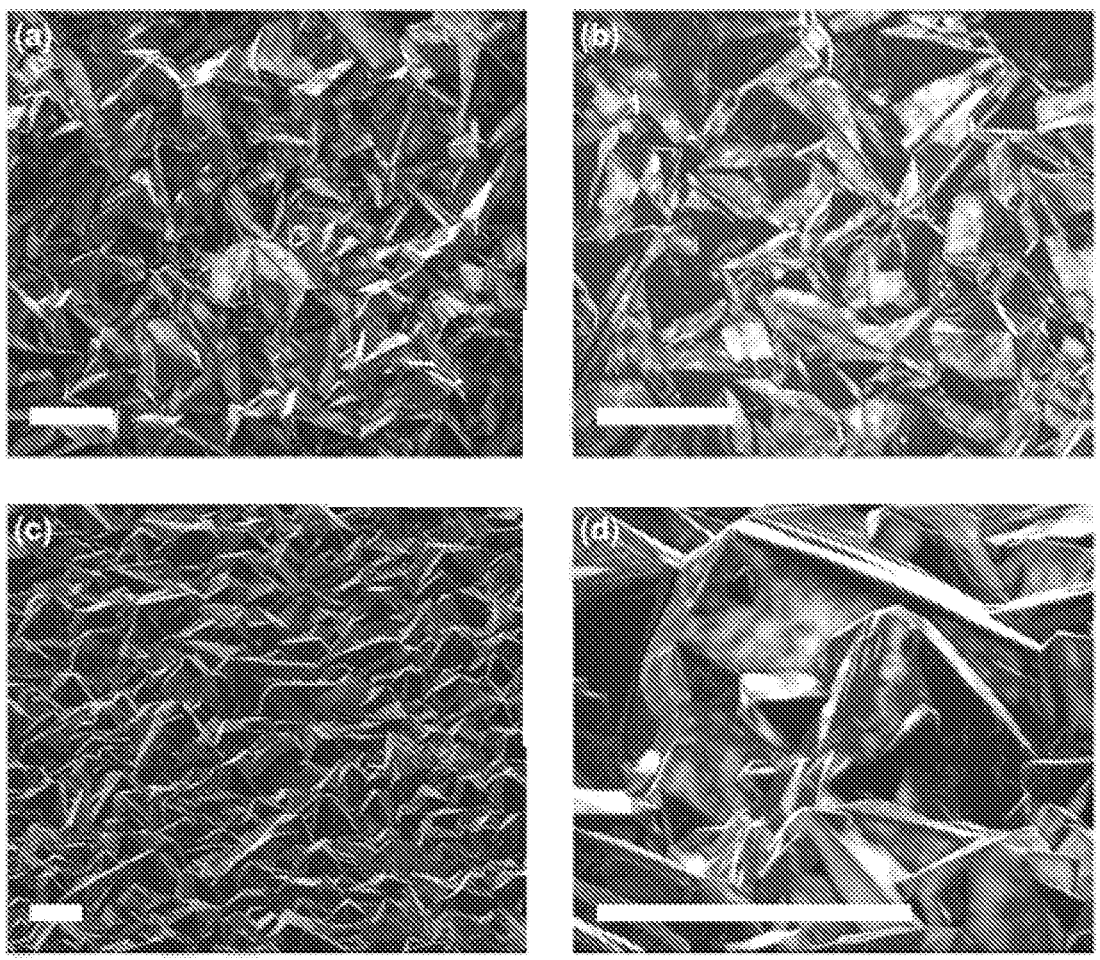
FIG. 2 is a series of scanning electron micrographs showing the surface of a boron-doped polycrystalline diamond grown on a molybdenum substrate. Panels (a) and (b) are micrographs taken at 0° tilting angle. Panels (c) and (d) are micrographs taken at 45° tilting angle. Scale bar=10 μm.

From the micrographs shown in FIG. 2 and FIG. 3, the grain sizes of the diamond film are estimated to range from about 1 μm, to about, to about 20 μm.

Figure 4:
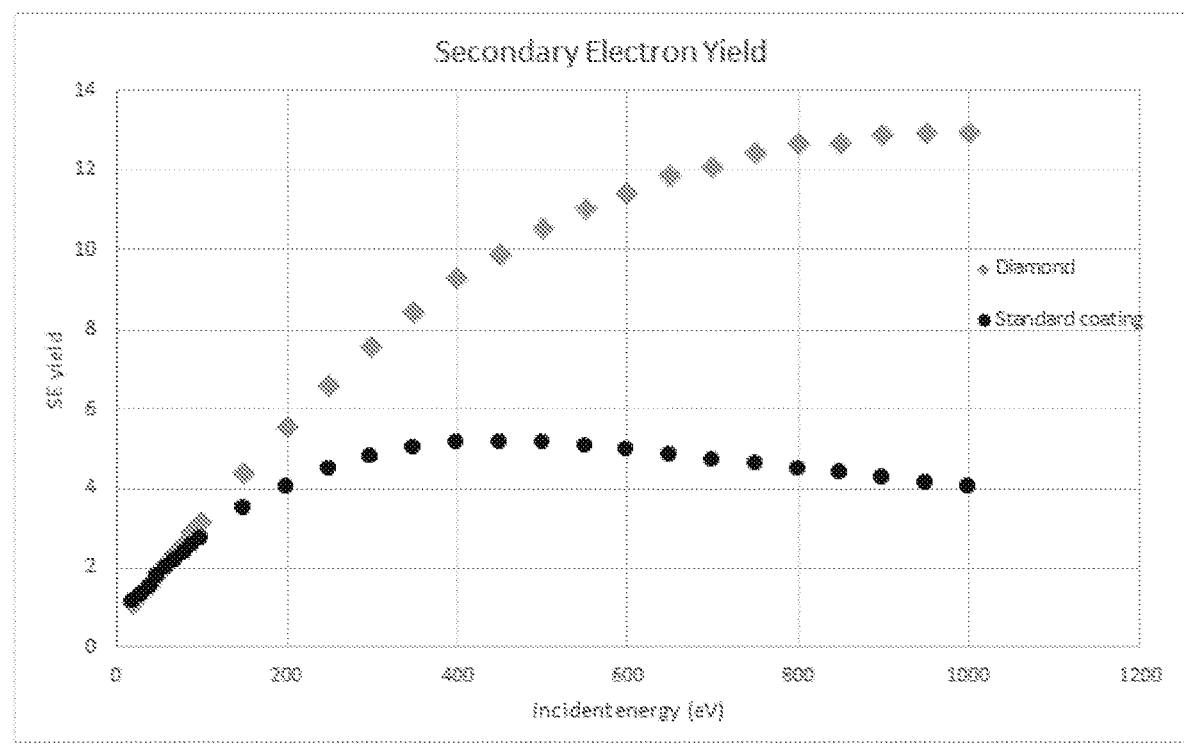
FIG. 4 is a graph comparing the secondary electron yield of a device of the present invention (produced in accordance with the illustrative embodiment described herein) compared to a prior art device. Both devices were operated in reflection mode.
Figure 5:
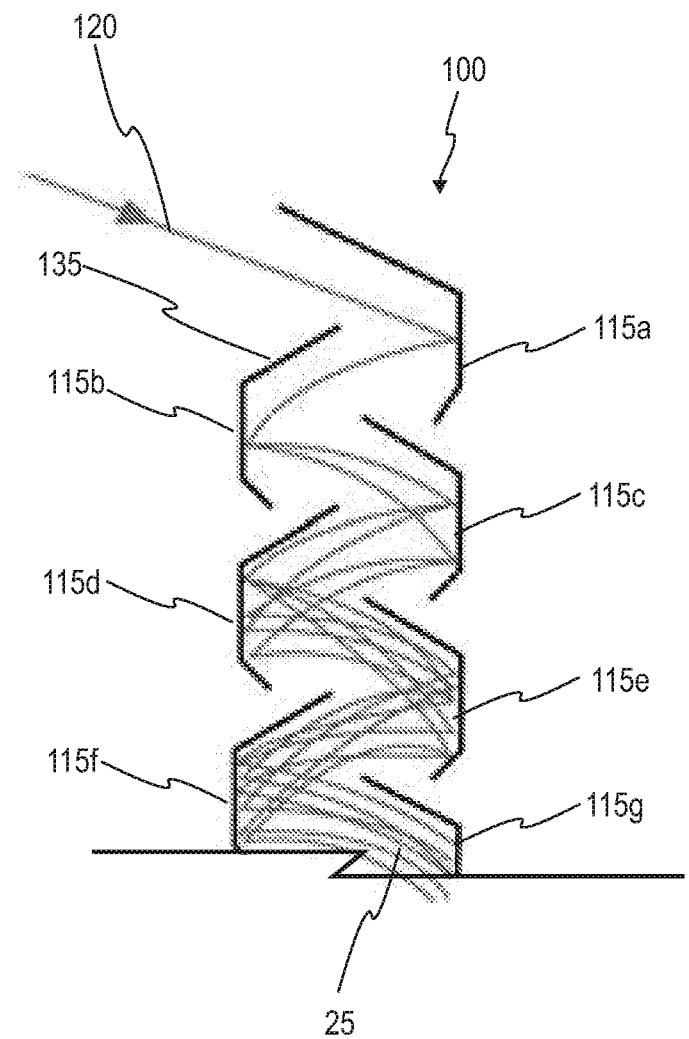
FIG. 5 is a highly schematic diagram showing the generation of a secondary electron avalanche in a prior art electron multiplier.
Figure 6:
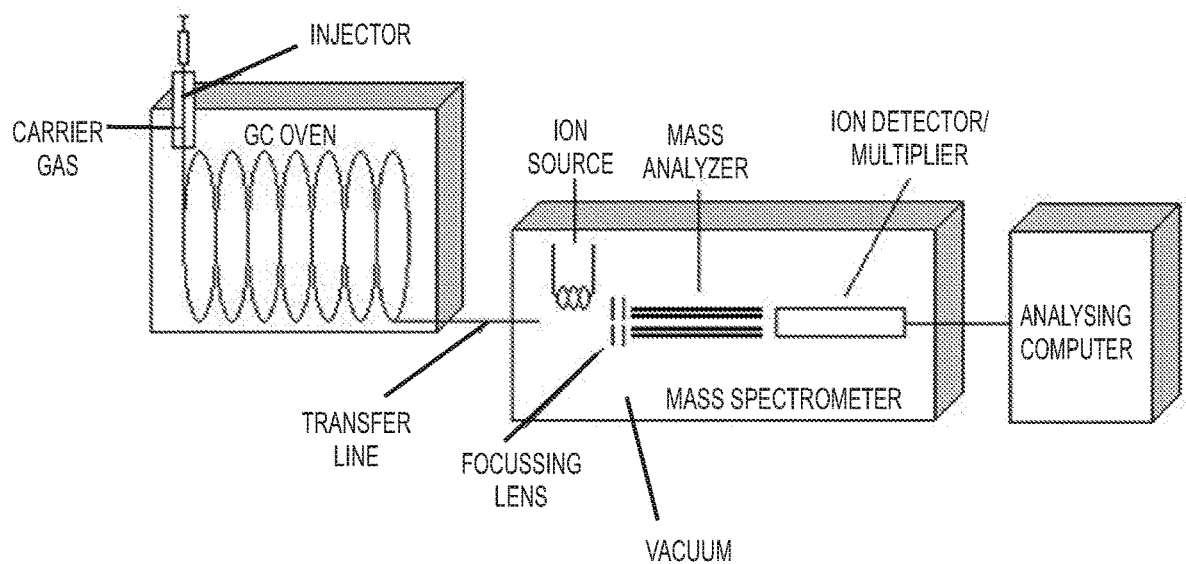
FIG. 6 is a highly schematic block diagram showing a typical arrangement whereby a gas chromatography instrument is coupled to a mass spectrometer, the mass spectrometer having an ion detector/electron multiplier having at least one dynode having a carbon-based layer functioning as an electron emissive material.

The dynode produced according the method described above was placed in a test rig to determine secondary electron yield. Electrons at increasing energy were directed at the hydrogen-terminated surface of the diamond film, with secondary electron yield being measured at a range of incident electron energies. The experiment was repeated under identical conditions for a standard dynode having an $Al_2O_3$-based material as the electron emissive material. The results of this comparative study are shown in the graph of FIG. 4. It will be noted that the yield from the dynodes is substantially the same for energies up to about 100 eV. For higher energies, the diamond film reflection dynode continues to increase substantially, before reaching an apparent maximum at a yield of 13 electrons.

By contrast, the standard reflection mode dynode rises at a lower rate with increasing energy, and peaks at a yield of about 4.5 electrons at an energy of around 400 eV. After the peak, yield gradually declines.

FIG. 4 demonstrates clearly the significant increase in yield when the boron-doped and hydrogen terminated polycrystalline diamond film as produced according this embodiment is used as an electron emissive material in a reflection dynode, as compared with a standard dynode. As will be appreciated from the Background section, increases in sensitivity of reflection mode dynodes have be sought after for decades, with prior artisans having limited success in that regard.

Those skilled in the art will appreciate that the invention described herein is susceptible to further variations and modifications other than those specifically described. It is understood that the invention comprises all such variations and modifications which fall within the spirit and scope of the present invention.

While the invention has been disclosed in connection with the preferred embodiments shown and described in detail, various modifications and improvements thereon will become readily apparent to those skilled in the art.

Accordingly, the spirit and scope of the present invention is not to be limited by the foregoing examples, but is to be understood in the broadest sense allowable by law.

The invention claimed is:

1. An ion detector comprising:
a space to admit a particle for detection, and
a device configured to convert or amplify an admitted particle in reflection mode, the conversion or amplification being reliant on an impact of the admitted particle on a surface of the device causing emission of one or more secondary electrons from the same surface, wherein the device comprises a polycrystalline carbon-based layer capable of secondary electron emission upon impact of a particle, wherein the polycrystalline carbon-based layer comprises a dopant and is hydrogen terminated on its surface, and wherein the device provides a secondary electron yield of at least 5 electrons for incident energies of at least about 200 eV with secondary electron yield increasing over incident energies between about 200 eV and about 600 eV.

2. The ion detector of claim 1, wherein the device is a conversion dynode or an amplification dynode or a microchannel wafer or a microchannel plate.

3. The ion detector of claim 1, wherein the carbon-based layer is a diamond layer or a diamond-like carbon layer.

4. The ion detector of claim 1, wherein the dopant is boron.

5. The ion detector of claim 1, wherein the substrate is a metal.

6. The ion detector of claim 5, wherein the metal is a transition metal.

7. A mass spectrometer comprising:
a mass analyzer; and
an ion detector comprising:
   a space to admit a particle for detection, and
   a device configured to convert or amplify an admitted particle in reflection mode, the conversion or amplification being reliant on an impact of the admitted particle on a surface of the device causing emission of one or more secondary electrons from the same surface, wherein the device comprises a polycrystalline carbon-based layer capable of secondary electron emission upon impact of a particle, wherein the polycrystalline carbon-based layer comprises a dopant and is hydrogen terminated on its surface, and wherein the device provide a secondary electron yield of at least 5 electrons for incident energies of at least about 200 eV with secondary electron yield increasing for incident energies between about 200 eV and about 600 eV.

8. A method comprising:
providing a device configured to convert or amplify an admitted particle in reflection mode, the conversion or amplification being reliant on an impact of the admitted particle on a surface of the device causing emission of one or more secondary electrons from the same surface, wherein the device comprises a polycrystalline carbon-based layer capable of secondary electron emission upon impact of a particle, wherein the polycrystalline carbon-based layer comprises a dopant and is hydrogen terminated on its surface, and
operating the device at an incident energy of at least about 200 eV to provide a secondary electron yield of at least about 5 electrons.

9. The method of claim 8, wherein the carbon-based layer is a diamond layer or a diamond-like carbon layer.

10. The method of claim 8, wherein the dopant is boron.

11. The method of claim 8, comprising operating the device at an incident energy of at least about 400 eV to provide a secondary electron yield of at least about 8 electrons.

12. The method of claim 8, comprising operating the device at an incident energy of at least about 600 eV to provide a secondary electron yield of at least about 10 electrons.

13. The method of claim 8, comprising operating the device at an incident energy of at least about 800 eV to provide a secondary electron yield of at least about 11 electrons.

* * * * *